(12) United States Patent
Mlcak (10) Patent No.: US 6,511,915 B2
(45) Date of Patent: Jan. 28, 2003

(54) ELECTROCHEMICAL ETCHING PROCESS

(75) Inventor: Richard Mlcak, Cambridge, MA (US)

(73) Assignee: Boston MicroSystems, Inc., Woburn, MA (US)

( * ) Notice: Subject to any disclaimer, the term of this patent is extended or adjusted under 35 U.S.C. 154(b) by 0 days.

(21) Appl. No.: 09/817,729

(22) Filed: Mar. 26, 2001

(65) Prior Publication Data

US 2002/0137348 A1 Sep. 26, 2002

(51) Int. Cl.[7] .............................................. H01L 21/311
(52) U.S. Cl. ...................................... 438/695; 438/466
(58) Field of Search ................................ 438/227, 229, 438/232, 233, 413, 466, 695, 463, 469, 473, 694

(56) References Cited

U.S. PATENT DOCUMENTS

| | | | |
|---|---|---|---|
| 2,846,346 A | 8/1958 | Bradley | 148/33 |
| 2,979,444 A | 4/1961 | Tiley | 204/143 |
| 3,067,114 A | 12/1962 | Tiley et al. | 204/143 |
| 3,085,055 A | 4/1963 | Bradley | 204/143 |
| 3,265,599 A | 8/1966 | Soonpaa | 204/143 |
| 3,643,232 A * | 2/1972 | Kilby | 340/173 R |
| 3,663,308 A * | 5/1972 | Davey | 148/1.5 |
| 4,491,856 A * | 1/1985 | Egawa et al. | 257/351 |
| 5,129,981 A | 7/1992 | Wang et al. | 156/628 |
| 5,129,982 A * | 7/1992 | Wang et al. | |
| 5,338,416 A | 8/1994 | Mlcak et al. | 204/129.3 |
| 5,348,627 A | 9/1994 | Propst et al. | 204/129.3 |
| 5,376,241 A | 12/1994 | Shor et al. | 204/129.3 |
| 5,454,915 A | 10/1995 | Shor et al. | 204/129.3 |
| 5,637,189 A * | 6/1997 | Peeters et al. | 438/466 |
| 6,034,001 A | 3/2000 | Shor et al. | 438/931 |

OTHER PUBLICATIONS

Hirata, M., et al., "Silicon Diaphragm Pressure Sensors Fabricated by Anodic Oxidation Etch–Stop," Sensors and Actuators, 13 (1988) 63–70.
Okojie, R.S.,et al., "α(6H)–SIC Pressure Sensors for High Temperature Applications," 146–149, © 1996 IEEE.
Okojie, R.S., et al., Operation of a α(6H)–SiC Pressure Sensor at 500° C. Sensors and Actuators A66 (1998) 200–204.

* cited by examiner

Primary Examiner—David Nems
Assistant Examiner—Phuc T. Dang
(74) Attorney, Agent, or Firm—Hamilton, Brook, Smith & Reynolds, P.C.

(57) ABSTRACT

A method of electrochemically etching a device, including forming a semiconductor substrate having a p-type semiconductor region on an n-type semiconductor region. A discrete semiconductor region is formed on the p-type semiconductor region and is isolated from the n-type semiconductor region. The n-type semiconductor region is exposed to an electrolyte with an electrical bias applied between the n-type semiconductor region and the electrolyte. The n-type semiconductor region is also exposed to radiation having energy sufficient to excite electron-hole pairs. In addition, a p-n junction reverse bias is applied between the p-type semiconductor region and the n-type semiconductor region to prevent the p-type semiconductor region and the discrete semiconductor region from etching while portions of the n-type semiconductor region exposed to the electrolyte and the radiation are etched.

32 Claims, 7 Drawing Sheets

ELECTROCHEMICAL ETCHING PROCESS

BACKGROUND

Some electronic devices, for example, particular types of sensors, actuators, electronics, optics, etc., have cost and performance advantages when manufactured from semiconductor materials on a miniature scale using microsystems or MEMS technology. Such miniature electronic devices can be formed with micromechanical structures such as membranes, cantilevered beams, microbridges, tethered proof masses, microhotplates, micromirrors, etc., which are integrated with transduction mechanisms such as piezoresistors, p-n junctions, field effect transistors, piezoelectric films, etc. In order for these miniature electronic devices to perform accurately, the micromechanical structures must be fabricated with precise dimensional control.

SUMMARY

The present invention is directed to a method of forming a device from semiconductor materials in which micromechanical structures with transduction mechanisms can be formed with dimensional precision. The method includes forming a semiconductor substrate having a p-type semiconductor region on an n-type semiconductor region. A discrete semiconductor region is formed on the p-type semiconductor region and is isolated from the n-type semiconductor region. The n-type semiconductor region is exposed to an electrolyte with an electrical bias applied between the n-type semiconductor region and the electrolyte. The n-type semiconductor region is also exposed to radiation having energy sufficient to excite electron-hole pairs.

In addition, a p-n junction reverse bias is applied between the p-type semiconductor region and the n-type semiconductor region to prevent the p-type semiconductor region and the discrete semiconductor region from etching while portions of the n-type semiconductor region exposed to the electrolyte and the radiation are etched.

In preferred embodiments, the radiation is light consisting of photons with energy greater than the band gap of the n-type semiconductor region to be etched. Etching the exposed portions of the n-type semiconductor region forms a mechanical structure from at least a portion of the p-type semiconductor region. Often, a portion of the n-type region that is beneath the p-type semiconductor region is etched. At least one of the p-type semiconductor region and the discrete semiconductor region can be formed by diffusion, implantation, deposition, and epitaxial growth. In some embodiments, the discrete semiconductor region is formed into a functional element, typically a transduction device such as a resistor or a piezoresistor. In other embodiments, the discrete semiconductor region in combination with the p-type semiconductor region forms a functional p-n junction such as a piezojunction, a photodiode, a photodetector, or a chemical sensor.

In some embodiments, a patterned radiation-opaque layer is formed over the p-type semiconductor region for blocking radiation and preventing etching of areas of the n-type semiconductor region covered by the radiation-opaque layer. Preferably, the patterned radiation-opaque layer is formed from an electrical contact on the p-type semiconductor region which is employed for applying the p-n junction reverse bias. In another embodiment, the n-type semiconductor region is exposed to radiation on a side opposite from the p-type semiconductor region. In such a case, an electrical contact is typically formed on the n-type semiconductor region on the side opposite from the p-type semiconductor region having radiation-permeable and radiation-opaque areas. The radiation-opaque areas prevent etching of areas of the n-type semiconductor region covered by the radiation-opaque areas.

Various mechanical structures are formed in accordance with the present invention as follows. A cantilevered beam of p-type material is formed by etching a cavity within the n-type semiconductor region under a portion of the p-type semiconductor region and beyond three sides thereof. In addition, a microbridge of p-type material is formed by etching a passage within the n-type semiconductor region under a portion of the p-type semiconductor region and beyond two opposite sides thereof. Also, a tethered proof mass of p-type material is formed by etching a passage within the n-type semiconductor region under a patterned p-type semiconductor region. A perforated membrane of p-type material is formed by forming openings through the p-type semiconductor region to expose areas of the n-type semiconductor region under the p-type semiconductor region to the electrolyte to allow etching of a cavity in the n-type semiconductor region under the p-type semiconductor region. Furthermore, a tethered microhotplate or micromirror is formed by forming openings through the p-type semiconductor region to expose areas of the n-type semiconductor region under the p-type semiconductor region to the electrolyte to allow etching of a cavity in the n-type semiconductor region under the p-type semiconductor region.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Figure 1:
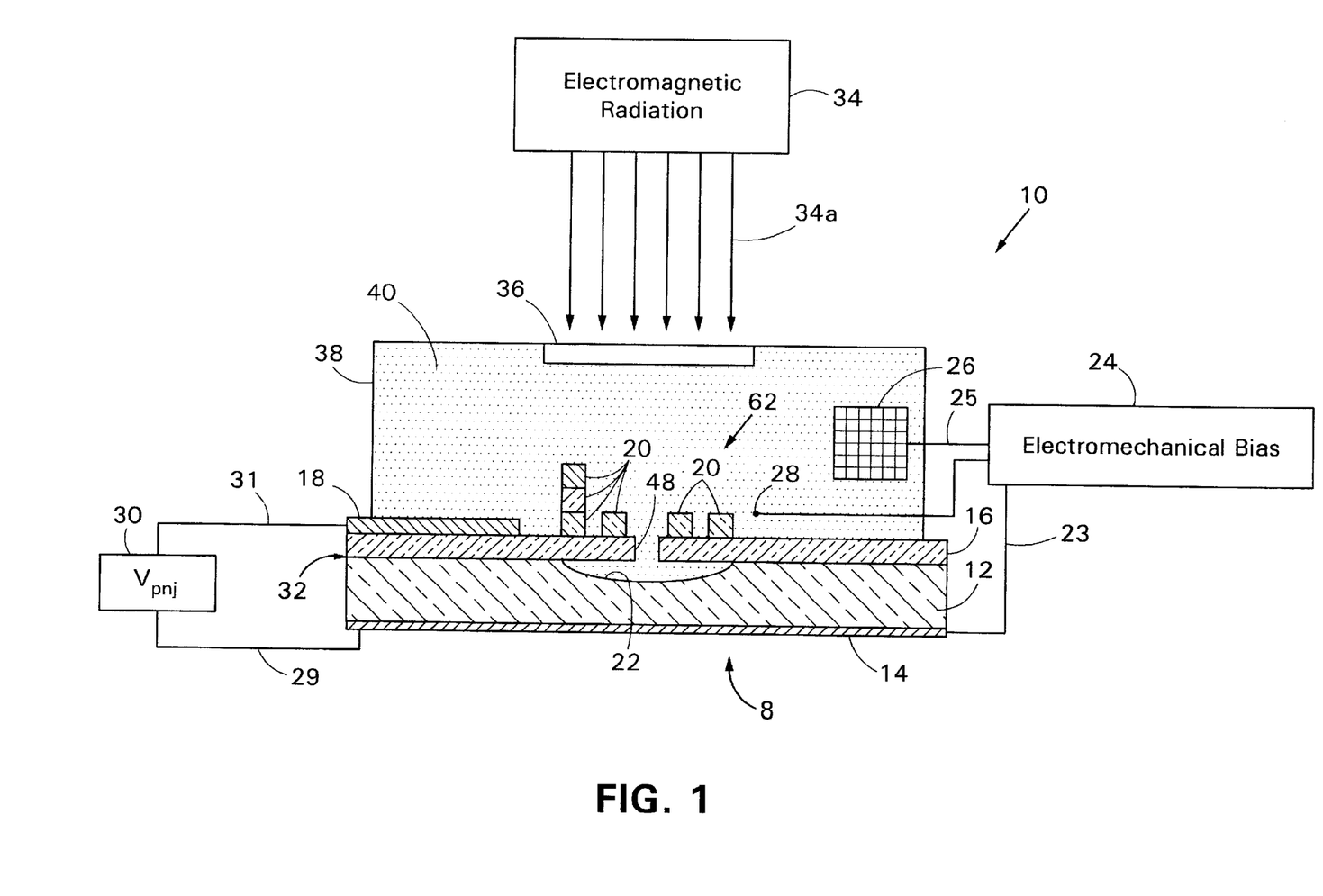
FIG. 1 is a schematic drawing of a semiconductor substrate having a p-type region over an n-type region, and discrete semiconductor regions on the p-type region, with the n-type region being etched by a photo-electro-chemical etching apparatus.

Referring to FIG. 1, in accordance with the present invention, photo-electro-chemical etching apparatus 10 is an apparatus for selectively etching semiconductor materials. In the present invention, when forming an electromechanical device 62, a semiconductor substrate 8 is first prepared for being etched by etching apparatus 10. Typically, the semiconductor substrate 8 includes a p-type semiconductor region or layer 16 that is formed over an n-type semiconductor region or layer 12. One or more individual or discrete semiconductor regions 20 for forming functional elements are located on or in the p-type region 16 and arc electrically isolated from the n-type region 12 by a p-n junction 32. Depending upon the device 62 to be manufactured, the discrete semiconductor regions 20 can be n-type, p-type, or intrinsic, and can be of the same or differing chemical composition and/or crystallographic structure as the n-type region 12 and/or p-type regions 16.

Etching apparatus 10 includes a container 38 for containing a supply of electrochemical electrolyte or etchant 40. The container 38 has an open side or bottom which is sealable against the semiconductor substrate 8 to be etched, allowing the electrochemical etchant 40 to contact the semiconductor substrate 8. Etching apparatus 10 typically operates best when semiconductor substrate 8 is oriented in an upright manner. An electromagnetic radiation source 34 for generating electromagnetic radiation 34a, typically light with the energies near and/or above the n-type semiconductor region 12 energy band gap, is positioned adjacent to container 38. Radiation source 34 directs the radiation 34a through a window 36 in the container 38, through the electrochemical etchant 40 and onto the semiconductor substrate 8 for generating electron-hole pairs.

An electrochemical bias source 24 is electrically connected by wire 23 to a contact 14 (typically a metallic film) on the back side of the n-type region 12 of semiconductor substrate 8 and by wire 25 to a counter electrode 26 immersed within the electrochemical etchant 40. An electrochemical bias source 24 is used to apply a positive (anodic) electrochemical bias to the n-type region 12. A reference electrode 28 is also electrically connected to bias source 24 and is positioned within electrochemical etchant 40 to provide a reference from which the potential drop or bias across the semiconductor substrate 8 and electrochemical etchant 40 interface can be measured and controlled by bias source 24. A p-n junction reverse bias source 30 having a voltage $V_{pn}$ is electrically connected by wire 29 to contact 14, and by wire 31 to a contact 18 on the front side of the p-type region 16 (typically a metallic film). Source 30 applies a p-n junction reverse bias between the p-type 16 and n-type 12 regions which overcomes the photo-bias generated across the illuminated p-n junction 32 and prevents the p-type region 16 from etching. The p-n junction reverse bias also prevents the discrete semiconductor regions 20 on the p-type region 16 from etching.

Consequently, the combination of the radiation 34a, the electrochemical etchant 40, the electrochemical bias generated by source 24, and the p-n junction reverse bias generated by source 30, results in etching or dissolving of portions of n-type region 12 that are in contact with the electrochemical etchant 40 and which receive radiation 34a, while at the same time, the p-type region 16 and discrete semiconductor regions 20 remain unetched. The reason this is possible is as follows. The n-type semiconductor region 12 will etch at sufficient anodic biases only when subjected to electromagnetic illumination 34a. Although the p-type semiconductor region 16 will etch at sufficient anodic biases regardless of radiation 34a, when a p-n junction reverse bias is applied to make the p-type region 16 and any discrete semiconductor regions 20 thereon sufficiently cathodic, etching of the regions 16/20 is negligible. As a result, the p-n junction 32 of semiconductor substrate 8 is used to form an etch stop.

Figure 2A:
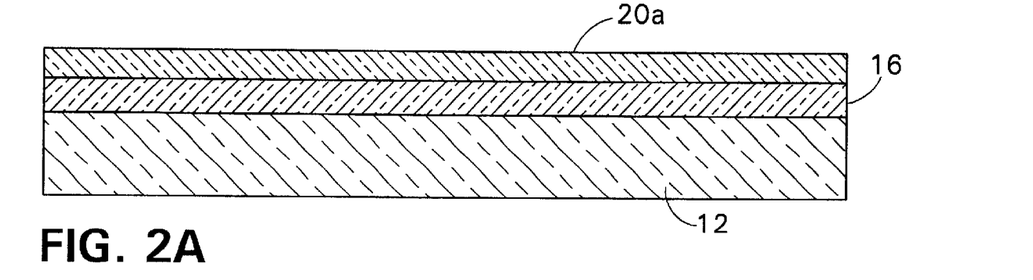
FIGS. 2A–2D are schematic cross-sectional drawings of a semiconductor substrate being formed into an electromechanical device in accordance with one fabrication method.
Figure 2B:
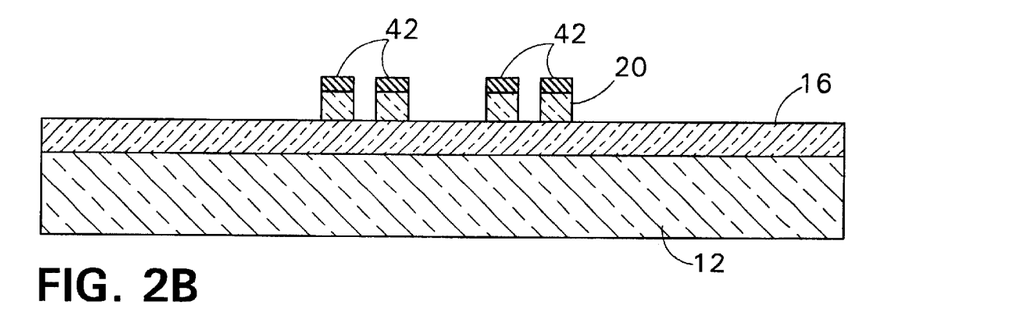
Figure 2C:
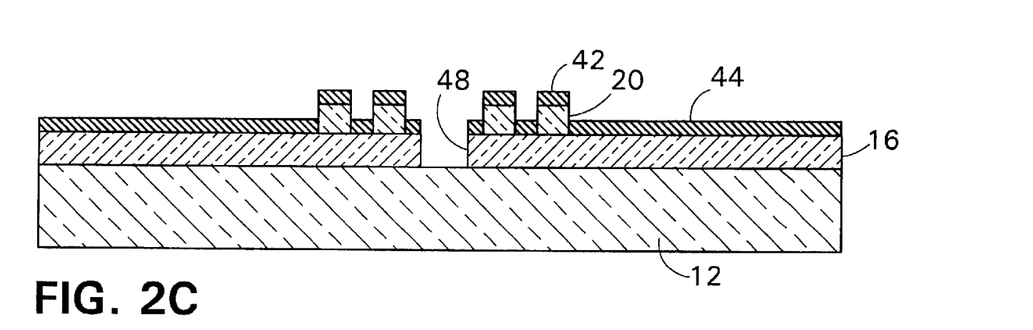

Referring to FIGS. 2A–2D, one method of fabricating an electromechanical device 62 (FIG. 2D) in accordance with the present invention is depicted. Before etching is performed by etching apparatus 10, the semiconductor substrate 8 is first prepared. In order to prepare the semiconductor substrate 8, a p-type region 16 is first formed on an n-type region 12 by epitaxial growth (FIG. 2A). A layer 20a of semiconductor material is formed over the p-type region 16 also by epitaxial growth. A patterned mask 42 is applied over the layer 20a, and portions of the layer 20a not covered by mask 42 are removed by etching to form a series of discrete semiconductor regions 20 (FIG. 2B). A second patterned mask 44 is applied over the p-type region 16 and portions of the p-type region 16 not covered by the mask 44 are removed by etching to form openings 48 through the p-type region 16 to the n-type region 12 (FIG. 2C). The masks 42 and 44 are removed and contacts 14/18 added, resulting in a prepared semiconductor substrate 8 that is ready for mounting to the container 38 of etching apparatus 10 for etching, as shown in FIG. 1.

Figure 2D:
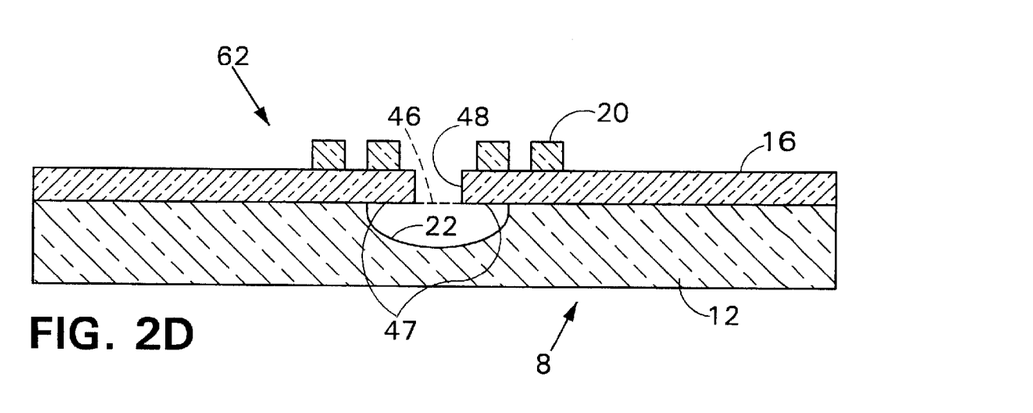

Referring to FIG. 2D, when semiconductor substrate 8 is etched by etching apparatus 10, the surface 46 of the n-type region 12 of semiconductor substrate 8 that is exposed to both the electrochemical etchant 40 and the radiation 34a etches away to form at least one cavity 22 within the n-type region 16. If desired, the etch time may be lengthened so that the cavity 22 extends below the p-type region 16 as shown. Etching of areas of the n-type region 12 located underneath the p-type region 16 is possible as long as such areas are in contact with the electrochemical etchant 40 and the radiation 34a is able to pass through the discrete semiconductor regions 20 and/or p-type region 16. Etching of the p-type region 16 and the discrete semiconductor regions 20 is prevented by the p-n junction reverse bias applied by source 30 (FIG. 1). Typically, a portion of the p-type region 16 extending over or adjacent to the at least one cavity 22 forms a freestanding mechanical structure 47 that forms part of the electromechanical device 62 and which is often capable of movement or deflection. The mechanical structure 47 can be a membrane, a perforated membrane, a cantilevered beam, a microbridge, a tethered proof mass, a microhotplate, micromirror, etc. The discrete semiconductor regions 20 on the p-type region 16 form the electrical transduction devices such as resistors, piezoresistors, piezojunctions, photodiodes, photodetectors, chemical sensors, piezoelectric actuators, etc., for the electromechanical device 62. Note that some discrete semiconductor regions 20 may be to the side of or offset from the mechanical structure 47.

Piezoresistors or piezojunctions (p-n junctions that change current-voltage characteristics when mechanically stressed) can be formed by oppositely doping the discrete semiconductor regions 20 from the p-type regions 16. When such discrete semiconductor regions 20 are located on a p-type mechanical structure 47 that is a membrane, the electromechanical device 62 can be employed as a pressure sensor or as a microphone. Also, when such regions 20 are located on a p-type mechanical structure 47 that is a tethered proof mass, electromechanical device 62 can be employed as an accelerometer, shock sensor or vibration sensor. In addition, when such regions 20 are located on a p-type mechanical structure 47 that is a microcantilevered beam or microbridge, electromechanical device 62 can be employed as a gas or chemical sensor based upon measurement of static or dynamic deflection of the cantilevered beam or microbridge.

In other embodiments, the p-type region 16 can include a microhotplate with the discrete semiconductor regions 20 forming active p-n junction elements thereon resulting in an electromechanical device 62 that can be employed as a chemical sensor. In addition, the discrete semiconductor regions 20 can be single or multilayer $Al_{1-x}Ga_xN$ piezoelectric films which are formed onto silicon (Si) or silicon carbide SiC micromechanical structures 47 of the p-type region 16, for example, resonant cantilevered beams, microbridges or diaphragms, resulting in an electromechanical device 62 that can be employed as a pressure, temperature, chemical or biological sensor. Furthermore, if the piezoelectric film is on a membrane and integrated with interdigital electrodes, the resulting electromechanical device 62 can be employed as a flexural plate wave fluid sensor for measuring viscosity, density, temperature and conductivity of fluids. If the piezoelectric film is on the tethers of a micromirror and integrated with electrodes for actuation, the resulting electromechanical device 62 can be employed as part of a micromirror display. The discrete semiconductor regions 20 can also be photodiodes or photodetectors which are placed upon a moveable mechanical structure 47 formed by the p-type region 16. Finally, the discrete semiconductor regions 20 can be a microelectronic circuit such as an amplifier, multiplexer, telemetry, etc., formed on or near a micromechanical structure 47 of the p-type region 16.

Figure 3A:
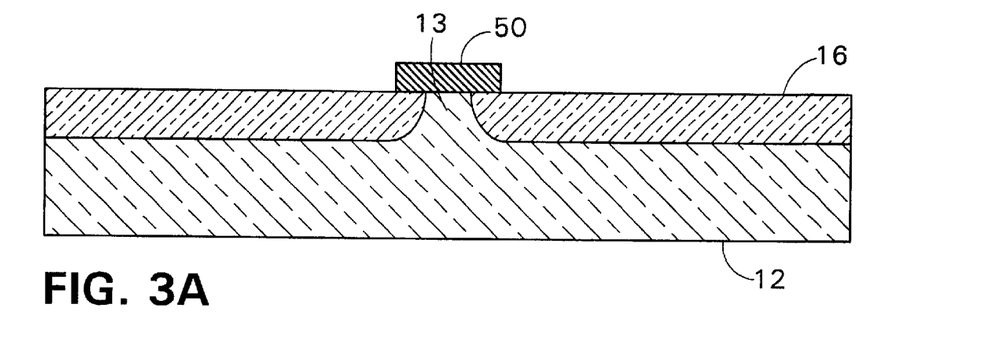
FIGS. 3A–3C are schematic cross-sectional drawings of a semiconductor substrate being formed into an electromechanical device in accordance with another fabrication method.
Figure 3B:
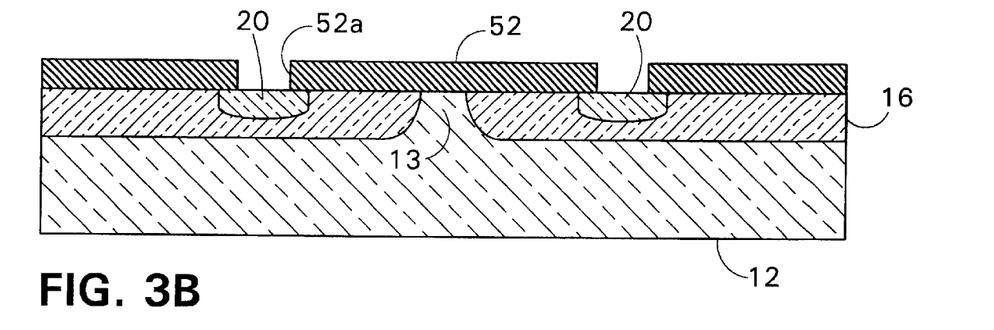
Figure 3C:
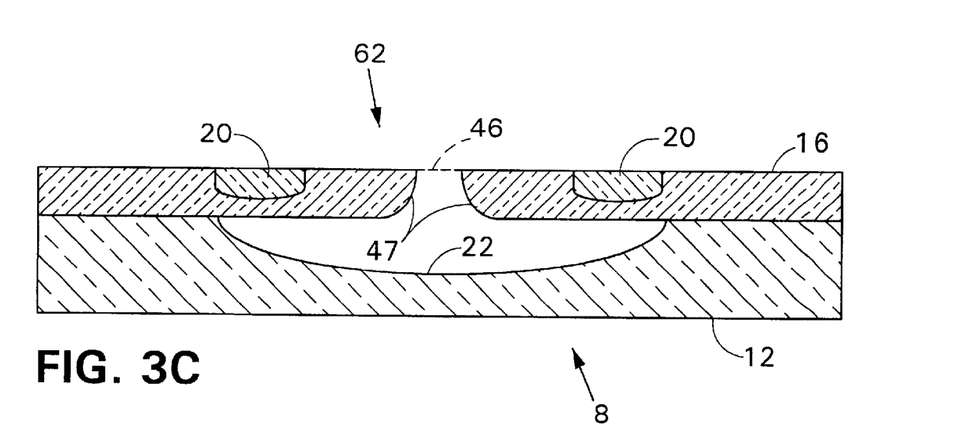

Referring to FIGS. 3A–3C, another method of fabricating an electromechanical device 62 (FIG. 3C) in accordance with the present invention is depicted. In order to prepare the semiconductor substrate 8 for etching by etching apparatus 10, a first patterned mask 50 (FIG. 3A) is formed on an n-type substrate 12. A p-type region 16 is then formed into the upper surface of the n-type region 12 by diffusion. Areas 13 covered by the mask 50 remain n-type. Mask 50 is removed and a second patterned mask 52 is formed over the surface of the p and n structure (FIG. 3B). Discrete semiconductor regions 20 are formed by diffusion within the p-type region 16 in areas not covered by mask 52 through openings 52a. The mask 52 is removed and contacts 14/18 added, resulting in a prepared semiconductor substrate 8 that is ready for mounting to the container 38 of etching apparatus 10 for etching, as shown in FIG. 1.

Referring to FIG. 3C, when semiconductor substrate 8 is etched by apparatus 10, the surface 46 of the n-type region 12 that is exposed to both the electrochemical etchant 40 and the radiation 34a, etches away to form at least one cavity 22 within the n-type region 12 resulting in an electromechanical device 62 having a mechanical structure 47. The at least one cavity 22 may extend under portions of the p-type region 16. As previously described, etching of the p-type region 16 and the discrete semiconductor regions 20 is prevented by the p-n junction reverse bias applied by source 30 (FIG. 1).

Figure 4A:
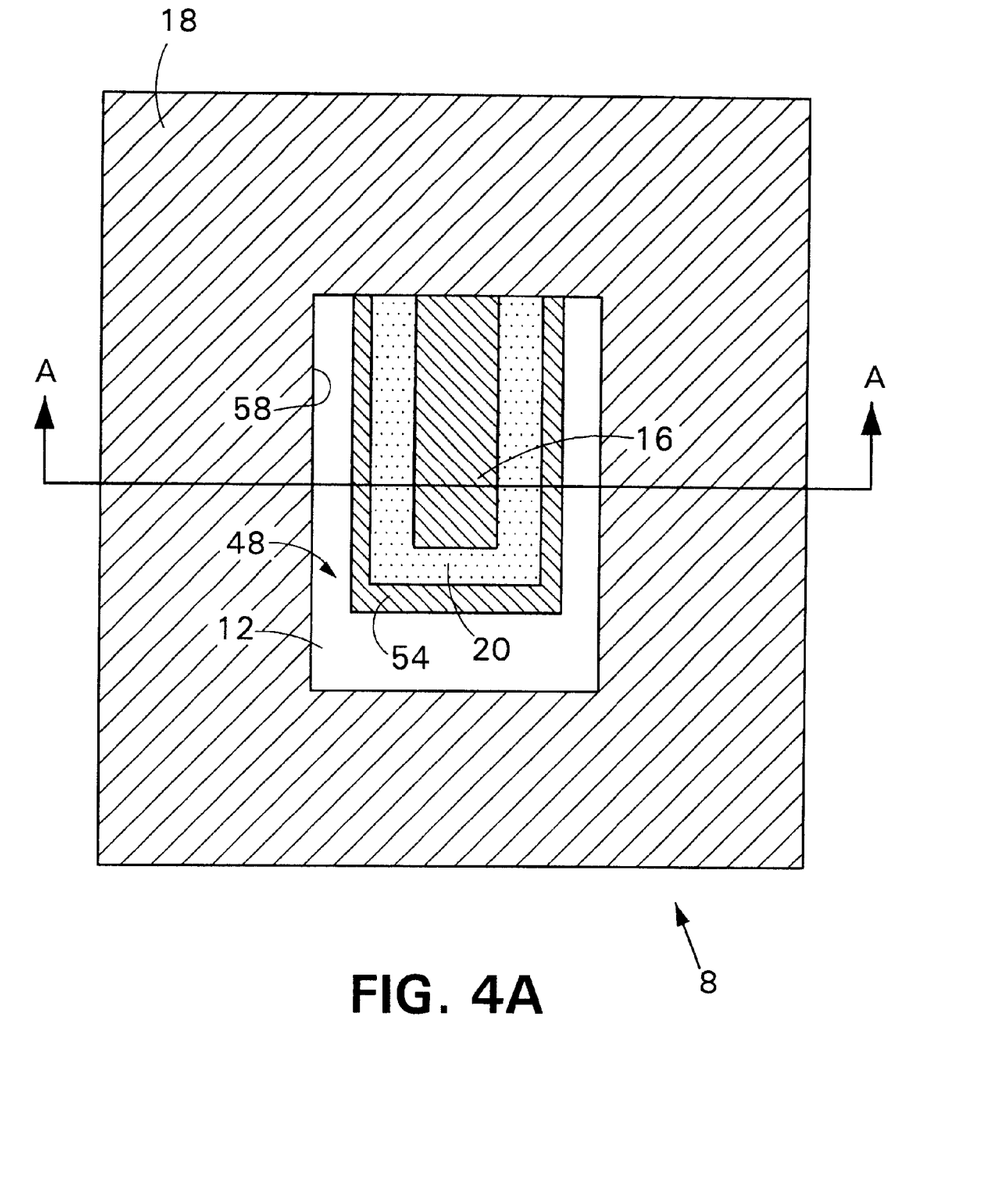
FIGS. 4A–4D are schematic drawings of a semiconductor substrate being formed into an electromechanical device having a cantilevered beam, with FIG. 4A being a plan view and FIGS. 4B–4D being cross-sectional drawings.
Figure 4B:
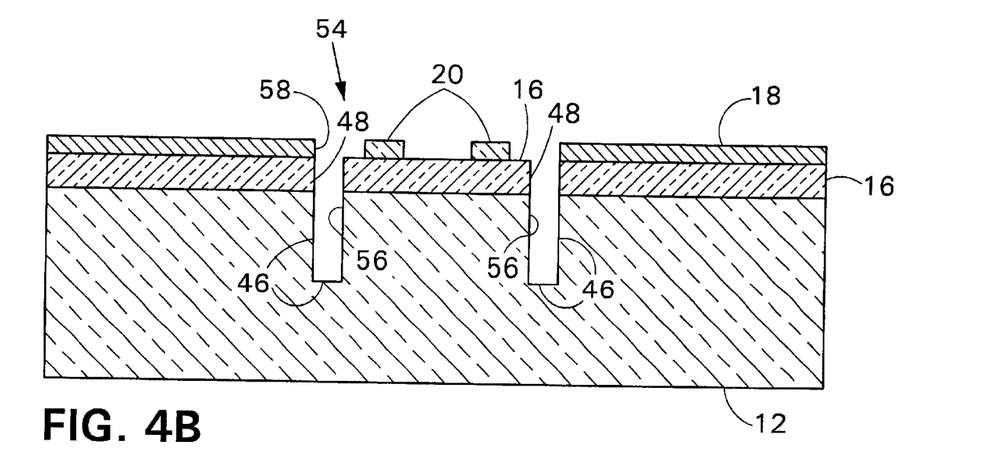

FIGS. 4A–4D depict a method of forming an electromechanical device 62 in accordance with the present invention where portions of the n-type region 12 become electrically isolated from each other during etching. FIG. 4A depicts a prepared semiconductor substrate 8 including a p-type region 16 on an n-type region 12 in which the p-type region 16 has a centrally located three sided p-type peninsula 54 from which a cantilevered beam is to be formed. The p-type peninsula 54 is formed by an U-shaped opening 48 through the p-type region 16. U-shaped opening 48 is formed by depositing a mask and etching as shown in FIG. 2C. However, the etch is allowed to proceed until a cavity 56 (FIG. 4B) extends into n-type region 12. This exposes an U-shaped cavity area of n-type region 12 with surfaces 46 for exposing to the electrolyte etchant 40. An U-shaped discrete semiconductor region 20 is formed on the peninsula 54. An electrical contact 18 covering the p-type region 16 has a central opening 58 leaving the p-type peninsula 54, the discrete semiconductor region 20 and the U-shaped area of the n-type region 12 exposed or uncovered. An electrical contact 14 is formed on the opposite side.

Figure 4C:
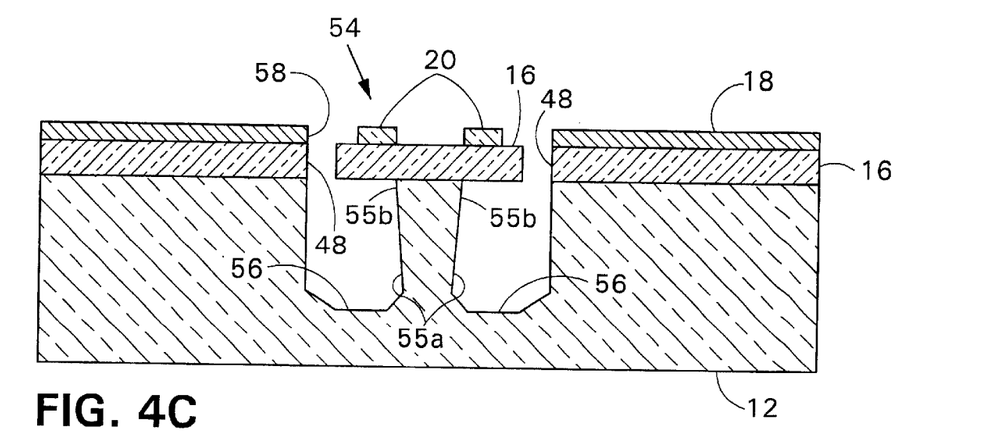
Figure 4D:
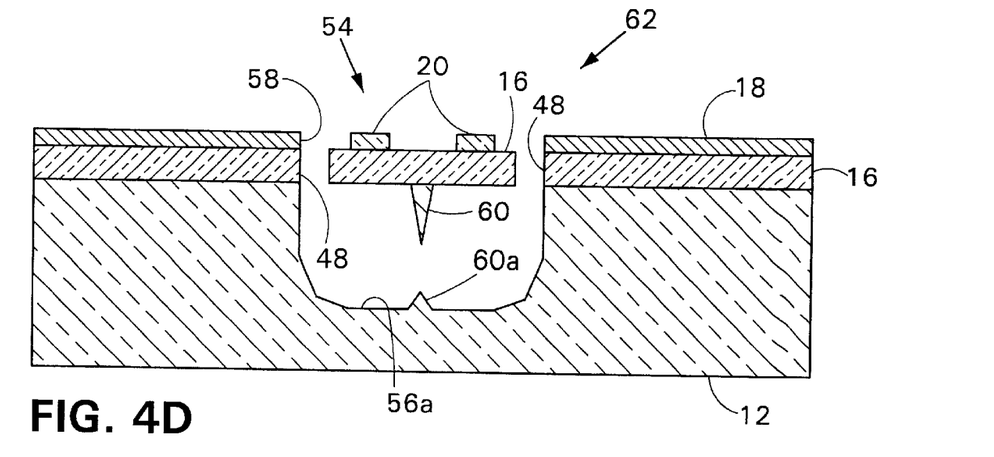

The semiconductor substrate 8 is mounted to container 38 of etching apparatus 10 for etching (FIG. 1). Referring to FIG. 4C, as etching progresses, the radiation 34a passes through the discrete semiconductor regions 20 and the p-type peninsula 54 so that etching of the n-type region 12 thereunder occurs. The inner bottom part 55a of trench 56 etches laterally faster than the upper part 55b because of the difference in anode potential between parts 55a and 55b due to an ohmic drop of electrochemical current flowing from electrical contact 14 through the n-type region 12 to the semiconductor/electrolyte interface. The electrical contact 18 is opaque to the radiation 34a and forms a lateral etch stop wherein little lateral etching of the n-type region 12 occurs under areas covered by contact 18. Referring to FIG. 4D, the U-shaped trench 56 eventually joins together to form a single cavity 56a around and under the p-type peninsula 54 which forms a cantilevered beam from peninsula 54. Since the inner bottom part 55a of trench 56 etches faster than the upper part 55b, the cavity 56a joins together at the bottom part 55a. A ridge 60 of electrically isolated n-type material remains attached to the bottom of the p-type peninsula 54. This ridge 60 becomes inert to etching once electrically isolated from n-type region 12.

As previously mentioned, a cantilevered beam is just one of a number of mechanical structures 47 that can be formed in accordance with the present invention. For example, a microbridge of p-type material can be formed by etching a passage within the n-type region 12 under a portion of the p-type region 16 and beyond two opposite sides thereof. In addition, a tethered proof mass of p-type material can be formed by etching a passage within the n-type region 12 under a patterned p-type region 16. Also, a perforated membrane of p-type material can be formed by forming openings through the p-type region 16 to expose areas of the n-type region 12 under the p-type region 12 to the etchant 40 to allow etching of a cavity 22 in the n-type region 12 directly under the p-type region 16. Furthermore, a tethered microhotplate or micromirror can be formed by forming openings through the p-type region 16 to expose areas of the n-type region 12 under the p-type region 16 to the etchant to allow etching of a cavity 22 in the n-type region 12 directly under the p-type region 16.

Figure 5:
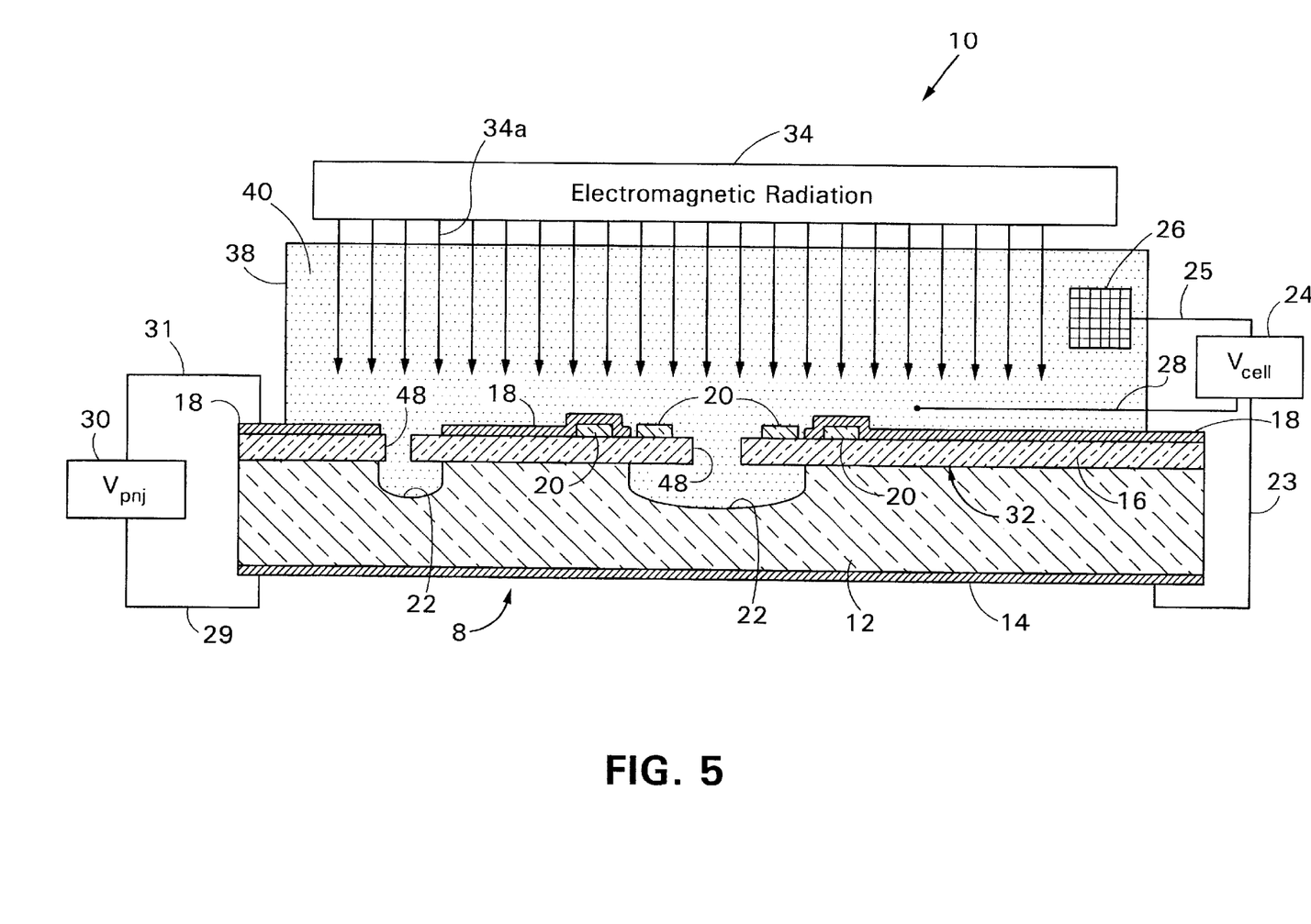
FIG. 5 is a schematic drawing of a semiconductor substrate having a p-type region over an n-type region, and discrete semiconductor regions on the p-type region, with the n-type region being etched by a photo-electro-chemical etching apparatus where lateral etching of the n-type region is controlled by a pattern of an opaque electrical contact which covers portions of the p-type region and selected discrete semiconductor regions.

FIG. 5 depicts a prepared semiconductor substrate 8 mounted to container 38 of etching apparatus 10 for etching. Semiconductor substrate 8 has two openings 48 through the p-type region 16. The electrical contact 18 is opaque to radiation 34a and is configured across the surface of p-type region 16 for defining the lateral dimensions of the etched cavities 22 within the n-type region 12. As previously mentioned, little etching occurs in areas of the n-type region 12 where the radiation 34a cannot reach. Note that contact 18 may cover the discrete semiconductor regions 20 when necessary. In cases where p-type regions 16 exist which are electrically isolated from each other, a p-n junction reverse bias must be applied to each electrically isolated region 16 to prevent etching thereof.

Figure 6:
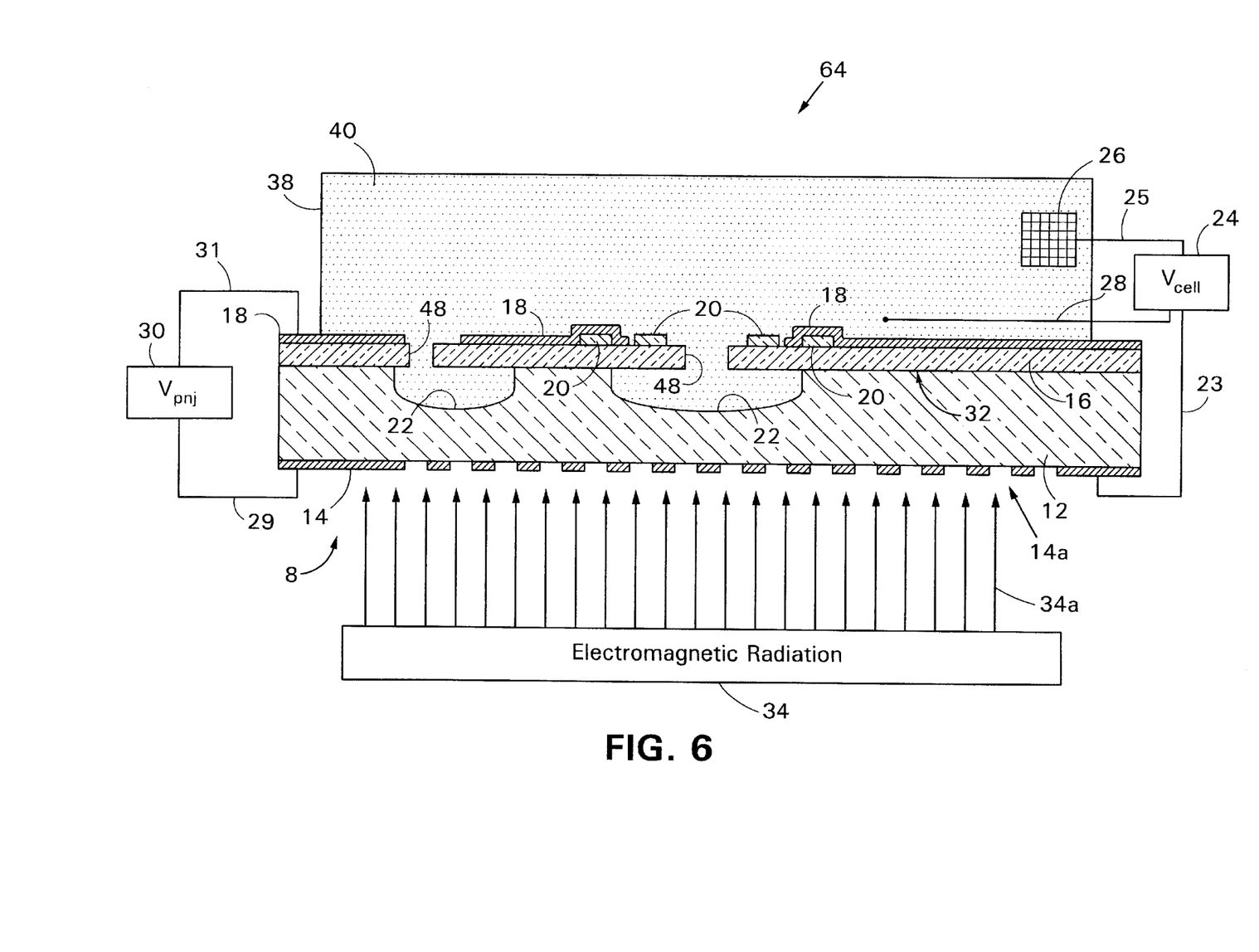
FIG. 6 is a schematic drawing of a semiconductor substrate having a p-type region over an n-type region, and discrete semiconductor regions on the p-type region, with the n-type region being etched by a photo-electro-chemical etching apparatus where electromagnetic radiation is directed on the side of the substrate that is opposite to the etchant.

Referring to FIG. 6, etching apparatus 64 differs from apparatus 10 in that the electromagnetic radiation source 34 is positioned to provide radiation 34a to the side of the semiconductor substrate 8 that is opposite to or facing away from container 38 and etchant 40. Typically, apparatus 64 is employed when the p-type region 16 is too opaque for the radiation 34a to reach the n-type region 12 and thereby unable to generate electron-hole pairs in n-type region 12. Usually in such a case, the p-type region 16 is too thick for the radiation 34a to pass through. The electrical contact 14 has a transparent or semitransparent region 14a to allow passage of the radiation 34a therethrough to n-type region 12 where it generates electron-hole pairs. In one embodiment, region 14a is semitransparent indium-tin oxide. In a second embodiment, region 14a is an opaque metal that is patterned into a grid. The electrical contact 14 can include opaque regions for defining some of the lateral dimensions of cavities 22.

The etching methods described above may be employed for most semiconductor materials. The chemical composition of the electrochemical etchant 40, and the electrochemical bias at which etching occurs differs depending upon the materials. Typical semiconductor materials are Si, SiC, GaAs and GaN. Typical etchants 40 for Si and SiC are 0.1% to 50% hydrofluoric acid (HF) solution, or other fluoride ion containing electrolytes such as $NH_4$ $HF_2$, etc. In addition, alcohol based (ethanol, methanol, etc.) solutions may be used. Other etchants for particular semiconductors may be employed as follows: 1 M KOH or $H_2SO_4:H_2O_2:H_2O$=5:1:1 for GaAs; 0.1 M KOH at 25° C. for GaN; HCl: $HNO_3:H_2O$= 1:1:20 for IP; 1 M $HClO_4$ or HCl for CdTe and CdSe; and HF, HCl and KOH for Ge. The radiation 34a generated by radiation source 34 is typically visible light but may be suitable non-visible electromagnetic radiation. Electrical contact 18 must be compatible with the etchant 40 used. One typical contact 18 when etching Si or SiC is 2000 Å of gold deposited on top of a 150 Å chromium adhesion layer.

While this invention has been particularly shown and described with references to preferred embodiments thereof, it will be understood by those skilled in the art that various changes in form and details may be made therein without departing from the scope of the invention encompassed by the appended claims.

For example, although terms such as front, over, on, below, under, covered, etc., are used in the above discussion, such terms are used to describe features in the orientation shown in the figures and are not meant to be limiting as to any particular orientation. Although continuous p-type 16 and n-type 12 regions have been shown in the figures, it is understood that a typical semiconductor substrate 8 may have more than one p-type 16 and n-type 12 region. Also, one or more discrete semiconductor regions 20 are typical, and some may be on top of each other. Although a p-type region 16 may be diffused into the n-type 12 region, the p-type region 16 may still be considered to be on the n-type region 12. Discrete semiconductor regions 20 formed in the p-type region 16 may also be considered on the p-type region 16. The prepared semiconductor substrate 8 may be formed by many different methods such as ion implantation and anneal, and vapor deposition, in addition to epitaxial growth and diffusion, as previously discussed. Combinations of such methods can also be employed. Also, the n-type region 12 is typically an n-type semiconductor substrate but can also be n-type semiconductor regions formed in and/or on a substrate. The semiconductor regions are preferably single crystal but are not so limited. Furthermore, the electromechanical devices 62 can include additional electrical or mechanical structures than described above.

What is claimed is:

1. A method of forming a device comprising:
   forming a semiconductor substrate having a p-type semiconductor region on an n-type semiconductor region;
   forming a discrete semiconductor region on the p-type semiconductor region, the discrete semiconductor region being isolated from the n-type semiconductor region;
   exposing the n-type semiconductor region to an electrolyte with an electrical bias applied between the n-type semiconductor region and the electrolyte;
   exposing the n-type semiconductor region to radiation having energy sufficient to excite electron-hole pairs; and
   applying a p-n junction reverse bias between the p-type semiconductor region and the n-type semiconductor region to prevent the p-type semiconductor region and the discrete semiconductor region from etching while portions of the n-type semiconductor region exposed to the electrolyte and the radiation are etched.

2. The method of claim 1 further comprising etching said exposed portions of the n-type semiconductor region for forming a mechanical structure from at least a portion of the p-type semiconductor region.

3. The method of claim 1 in which exposing the n-type semiconductor region to radiation comprises exposing the n-type semiconductor region to light.

4. The method of claim 1 further comprising forming the discrete semiconductor region into a functional element.

5. The method of claim 4 further comprising forming the functional element into a transduction device.

6. The method of claim 5 further comprising forming the discrete semiconductor region into a resistor.

7. The method of claim 5 further comprising forming the discrete semiconductor region into a piezoresistor.

8. The method of claim 1 further comprising forming a functional p-n junction between the p-type semiconductor region and the discrete semiconductor region.

9. The method of claim 8 further comprising forming the functional p-n junction into a piezojunction.

10. The method of claim 8 further comprising forming the functional p-n junction into a photodiode.

11. The method of claim 8 further comprising forming the functional p-n junction into a photodetector.

12. The method of claim 8 further comprising forming the functional p-n junction into a chemical sensor.

13. The method of claim 1 further comprising forming at least one of the p-type semiconductor region and the discrete semiconductor region by diffusion.

14. The method of claim 1 further comprising forming at least one of the p-type semiconductor region and the discrete semiconductor region by implantation.

15. The method of claim 1 further comprising forming at least one of the p-type semiconductor region and the discrete semiconductor region by deposition.

16. The method of claim 1 further comprising forming at least one of the p-type semiconductor region and the discrete semiconductor region by epitaxial growth.

17. The method of claim 2 further comprising etching a portion of the n-type semiconductor region that is beneath the p-type semiconductor region.

18. The method of claim 17 further comprising etching a cavity within the n-type semiconductor region under a portion of the p-type semiconductor region and beyond three sides thereof to form a cantilevered beam of p-type material.

19. The method of claim 17 further comprising etching a passage within the n-type semiconductor region under a portion of the p-type semiconductor region and beyond two opposite sides thereof to form a microbridge of p-type material.

20. The method of claim 17 further comprising etching a passage within the n-type semiconductor region under a patterned p-type semiconductor region to form a tethered proof mass of p-type material.

21. The method of claim 17 further comprising forming openings through the p-type semiconductor region to expose areas of the n-type semiconductor region under the p-type semiconductor region to the electrolyte to allow etching of a cavity in the n-type semiconductor region under the p-type semiconductor region to form a perforated membrane of p-type material.

22. The method of claim 17 further comprising forming openings through the p-type semiconductor region to expose areas of the n-type semiconductor region under the p-type semiconductor region to the electrolyte to allow etching of a cavity in the n-type semiconductor region under the p-type semiconductor region to form a tethered microhotplate.

23. The method of claim 17 further comprising forming openings through the p-type semiconductor region to expose areas of the n-type semiconductor region under the p-type semiconductor region to the electrolyte to allow etching of a cavity in the n-type semiconductor region under the p-type semiconductor region to form a tethered micromirror.

24. The method of claim 1 further comprising forming a patterned radiation-opaque layer over the p-type semiconductor region for blocking radiation and preventing etching of areas of the n-type semiconductor region covered by the radiation-opaque layer.

25. The method of claim 24 further comprising forming the patterned radiation-opaque layer from an electrical contact located on the p-type semiconductor region which is employed for applying the p-n junction reverse bias.

26. The method of claim 1 further comprising exposing the n-type semiconductor region to the radiation on a side opposite from the p-type semiconductor region.

27. The method of claim 26 further comprising forming an electrical contact on the n-type semiconductor region on said opposite side from the p-type semiconductor region, the electrical contact having radiation permeable and opaque areas, the radiation-opaque areas preventing etching of areas of the n-type semiconductor region covered by the radiation-opaque areas.

28. A method of electrochemically etching a device comprising:

forming a semiconductor substrate having a p-type semiconductor region on an n-type semiconductor region;

forming a discrete semiconductor region on the p-type semiconductor region, the discrete semiconductor region being isolated from the n-type semiconductor region and for forming a functional element;

exposing the n-type semiconductor region to an electrolyte with an electrical bias applied between the n-type semiconductor region and the electrolyte;

exposing the n-type semiconductor region to radiation having energy sufficient to excite electron-hole pairs; and applying a p-n junction reverse bias between the p-type semiconductor region and the n-type semiconductor region to prevent the p-type semiconductor region and the discrete semiconductor region from etching while portions of the n-type semiconductor region exposed to the electrolyte and the radiation are etched, etching of said portions of the n-type semiconductor region forming a mechanical structure from at least a portion of the p-type semiconductor region.

29. The method of claim 28 further comprising forming the functional element into a transduction device.

30. The method of claim 28 further comprising forming a patterned radiation-opaque layer over the p-type semiconductor region for blocking radiation and preventing etching of areas of the n-type semiconductor region covered by the radiation-opaque layer.

31. The method of claim 28 in which exposing the n-type semiconductor region to radiation comprises exposing the n-type semiconductor region to light.

32. A method of electromechanically etching a device comprising:

providing a semiconductor substrate having a p-type semiconductor region on an n-type semiconductor region;

forming a discrete semiconductor region on the p-type semiconductor region, the discrete semiconductor region being isolated from the n-type semiconductor region;

exposing the n-type semiconductor region to an electrolyte with an electrical bias applied between the n-type semiconductor region and the electrolyte;

exposing the n-type semiconductor region to light having energy sufficient to excite electron-hole pairs; and applying a p-n junction reverse bias between the p-type semiconductor region and the n-type semiconductor region to prevent the p-type semiconductor region and the discrete semiconductor region from etching while portions of the n-type semiconductor region exposed to the electrolyte and the light are etched.

\* \* \* \* \*